US012771367B2

(12) United States Patent
Liu et al.

(10) Patent No.: US 12,771,367 B2
(45) Date of Patent: Oct. 20, 2026

(54) SIGNAL PROCESSOR APPARATUS

(71) Applicant: UCL BUSINESS LTD, London (GB)

(72) Inventors: Zhixin Liu, London (GB); Callum Deakin, London (GB)

(73) Assignee: UCL BUSINESS LTD, London (GB)

( * ) Notice: Subject to any disclaimer, the term of this patent is extended or adjusted under 35 U.S.C. 154(b) by 1092 days.

(21) Appl. No.: 17/905,000

(22) PCT Filed: Feb. 24, 2021

(86) PCT No.: PCT/GB2021/050452
§ 371 (c)(1),
(2) Date: Aug. 25, 2022

(87) PCT Pub. No.: WO2021/170996
PCT Pub. Date: Sep. 2, 2021

(65) Prior Publication Data

US 2023/0086455 A1 Mar. 23, 2023

(30) Foreign Application Priority Data

Feb. 25, 2020 (GB) ..................................... 2002647

(51) Int. Cl.
*H03M 1/00* (2006.01)
*H03M 1/12* (2006.01)

(52) U.S. Cl.
CPC ....... *H03M 1/121* (2013.01); *H04B 2210/006* (2013.01)

(58) Field of Classification Search
CPC .. H03M 1/121; H04B 2210/006; H04B 10/00
(Continued)

(56) References Cited

U.S. PATENT DOCUMENTS

| | | | | |
|---|---|---|---|---|
| 10,523,329 | B2 | 12/2019 | Esman et al. | |
| 2018/0267340 | A1* | 9/2018 | Rohde | G02F 1/225 |
| 2019/0013869 | A1* | 1/2019 | Alic | H01S 3/1083 |

FOREIGN PATENT DOCUMENTS

| | | | |
|---|---|---|---|
| CN | 108418629 | A | 8/2018 |
| WO | 2017067617 | A1 | 4/2017 |
| WO | 2018044500 | A1 | 3/2018 |

OTHER PUBLICATIONS

UK Intellectual Property Office Search Report dated Jul. 29, 2020.
(Continued)

*Primary Examiner* — Jean B Jeanglaude
(74) *Attorney, Agent, or Firm* — Shumaker, Loop & Kendrick, LLP

(57) ABSTRACT

A signal processor apparatus includes: first and second photonic comb generators generating respective first and second combs with respective different first and second tone spacing; modulator modulating the first comb with an analog input signal; combiner combining the modulated first comb with the second comb and directing the combination results to first and second arms; spectral filter unit for each arm dividing each arm into a plurality of sub-bands; plurality of photodetectors, one for each sub-band of each arm, each photodetector outputting an electrical signal carrying information on the respective sub-band of the input signal; phase-shifter adjusting a relative phase of the first and second combs with respect to each other prior to the combiner; sensor system producing an output related to a phase difference between the first and second combs at the combiner; and controller controlling the phase-shifter based on the output of the sensor system.

20 Claims, 2 Drawing Sheets

(58) Field of Classification Search
USPC .......................................................... 341/137
See application file for complete search history.

(56) References Cited

OTHER PUBLICATIONS

Deakin, C. and Liu, Z. "Dual frequency comb assisted analog-to-digital conversion." Optics Letters, vol. 45, No. 1/Jan. 1, 2020, pp. 173-176.
V. Ataie et al., Subnoise Detection of a Fast Random Event, Science, Dec. 11, 2015, pp. 1343-1346, vol. 350, Issue 6266, American Association for the Advancement of Science, Washington, DC, USA.
Daniel J. Esman et al., Frequency-Hopping Pulse Position Modulation Ultrawideband Receiver, Journal of Lightwave Technology, May 15, 2017, pp. 1894-1899, vol. 35, No. 10, Optical Society and IEEE Photonics Society (Optica Publishing Group), Washington, DC, USA.
H. Hu et al., Realtime Comb-Assisted Discrete Fourier Transform Processor, CLEO Pacific Rim 2018 Conference, 2018, pp. 1-2, Tu2D.6, Optica Publishing Group, Washington, DC, USA.

* cited by examiner

SIGNAL PROCESSOR APPARATUS

FIELD OF THE INVENTION

The present invention relates to a signal processor apparatus.

BACKGROUND OF THE INVENTION

Signals arise across nearly every discipline. Analyzing both the time and spectral behavior of these signals is key to driving a vast variety of scientific progress: from fundamental biology and physics, to engineering and the development of new technologies, such as advances in telecommunications.

Conventional systems digitize the received analog signal (voltage or current) using high-speed analog to digital converters (ADCs) before performing digital signal processing to capture the signal characteristics. However, this approach faces substantial challenges when dealing with the high frequency, broadband signals that can occur in current scientific research or when designing modern information technology. The fundamental trade-off between the speed and precision of an ADC leads to a significant reduction in precision when coping with high frequency signals. Furthermore, since the speed of the ADC is also inversely proportional to its transistor size, the current minimum transistor sizes (around 7-14 nm) imposes a further reduction in precision when demanding a higher speed ADC. Furthermore, the limited number of instruction-per-second in a processor (i.e. the processor clock frequency) is approaching its upper bound in speed set by the quantum and thermal effects in silicon processors. This precludes the use of complex DSP such as deep-learning algorithms to identify and reveal insight into signals in real time.

One approach to improve on the above is to use a dual comb technique, as illustrated in FIG. 1. Light from a common laser source 10 is split and used to seed two photonic comb generators 12, 14. The output of the first photonic comb generator 12 will be referred to as the signal comb, and the output of the second photonic comb generator 14 will be referred to as the LO comb (local oscillator comb). The tone spacing of the signal comb is $f_{sig}$ and the tone spacing of the LO comb is $f_{ref}$, which differs from $f_{sig}$ by a frequency difference of Δf. In this case $f_{ref}=f_{sig}+\Delta f$. The signal comb is modulated at a modulator 16 by the signal being processed, x(t), and then combined with the LO comb at combiner 18. The combination is then demultiplexed into n channels with a channel spacing of $f_{sig}$ by a spectral filter unit 20. When the n-th channel is incident on a respective photoreceiver PRO, the beating between the n-th tone of the LO comb and the modulated n-th tone of the signal comb will generate a baseband signal centered at a frequency nΔf. A bank of n ADCs can then be used to interrogate n spectral slices (i.e. sub-bands) of width Δf of the original signal being processed. The parallel detection means that each sub-band can be detected with a low noise photoreceiver and digitized using low-speed but high-resolution ADCs, and the whole signal spectrum can, if required, be reconstructed at a resolution beyond the fundamental limit of a single wide-bandwidth ADC. In other words, the problem of broadband signal detection has been transformed to parallel detection of multiple sub-bandwidth signals before the analog to digital conversion. This then allows a bank of low-speed but high resolution ADCs to work in parallel, substantially reducing both the speed and accuracy requirements of the ADCs. Furthermore, the optical spectral decomposition enables parallel digital signal processing (DSP) of the sub-bands without requiring any electronic processing to decompose the input signal into sub-bands.

However, the technique of FIG. 1 requires coherent detection of all sub-bands in order to reconstruct the original signal. This necessitates the use of expensive coherent receivers, which typically have additional loss due to coherent hybrid, resulting in a significant decrease in performance and increase in cost.

SUMMARY OF THE INVENTION

The present invention has been devised in view of the above problems.

Accordingly, the present invention provides a signal processor apparatus comprising:

- a first photonic comb generator for generating a first comb with a first tone spacing;
- a second photonic comb generator for generating a second comb with a second tone spacing, different from said first comb spacing;
- a modulator arranged to modulate the first comb with an analog input signal;
- a combiner to combine the modulated first comb with the second comb and to direct the results of the combination to a first arm and a second arm;
- a spectral filter unit for each arm to divide each arm into a plurality of sub-bands; and
- a plurality of photodetectors, one for each sub-band of each arm, each photodetector for outputting an electrical signal carrying information on the respective sub-band of the input signal, the apparatus further comprising:

- a phase-shifter for adjusting a relative phase of the first and second combs with respect to each other prior to the combiner;
- a sensor system for producing an output related to a phase difference between the first and second combs at the combiner; and
- a controller arranged to control the phase-shifter based on the output of the sensor system.

Embodiments of the invention exploit the natural symmetry of the frequency combs to enable detection of the in-phase and quadrature components of an arbitrary signal x(t), such that full-field (amplitude and phase) detection can be realized.

DESCRIPTION OF THE DRAWINGS

Embodiments of the invention will now be described, by way of example only, with reference to the accompanying drawings, in which.

Figure 1:
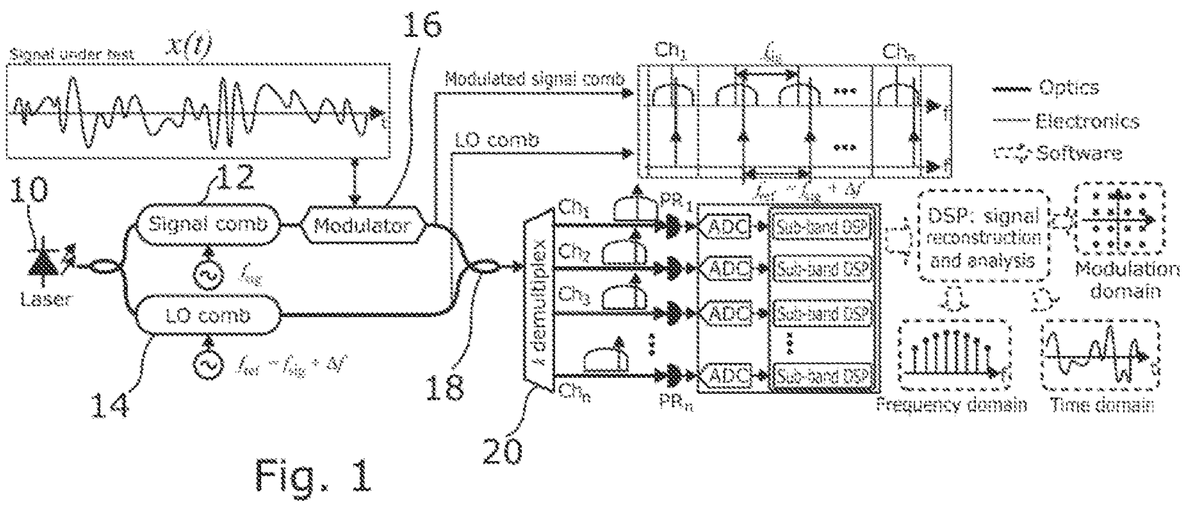
Fig. 1 (PRIOR ART)
FIG. 1 is a schematic illustration of an apparatus employing the dual comb detection technique described above.

In the drawings, like parts are given like reference signs, and duplicate description thereof is omitted. Terms such as "photonic", "optical" and "light" used herein do not limit the subject matter in any way to visible light, but encompass any suitable region of the electromagnetic spectrum, including at least infra-red (IR), visible, and ultra-violet (UV).

DETAILED DESCRIPTION OF THE INVENTION

Figure 2:
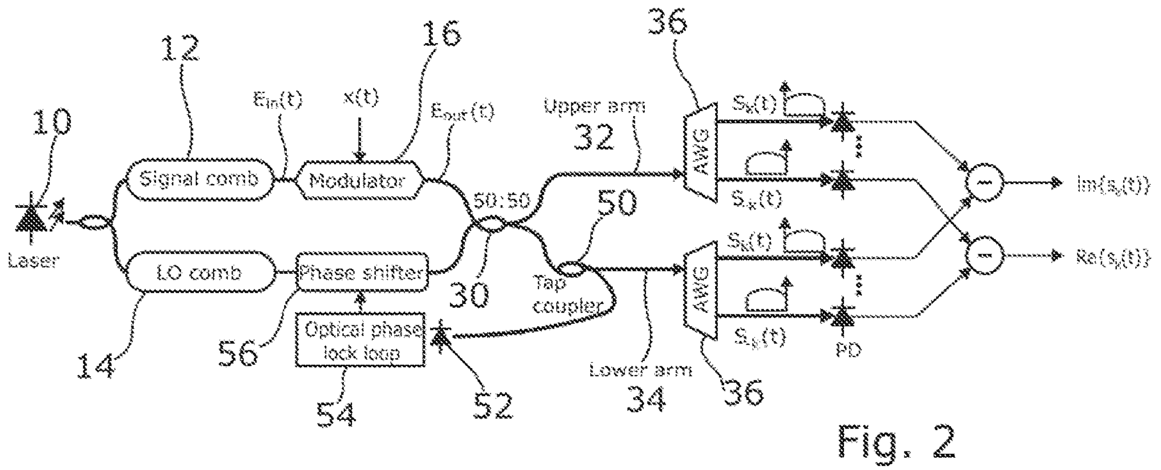
FIG. 2 is a schematic illustration of a signal processor apparatus according to a first embodiment of the invention.

A first embodiment of the invention is illustrated in FIG. 2. A coherent light source 10 seeds the first and second photonic comb generators 12, 14, as described above. Each resulting photonic comb effectively comprises a range of discrete, evenly spaced frequencies referred to as 'tones'. The term 'photonic comb' will be abbreviated to 'comb' herein for conciseness. However, the tone spacing is different for the two combs.

Figure 3:
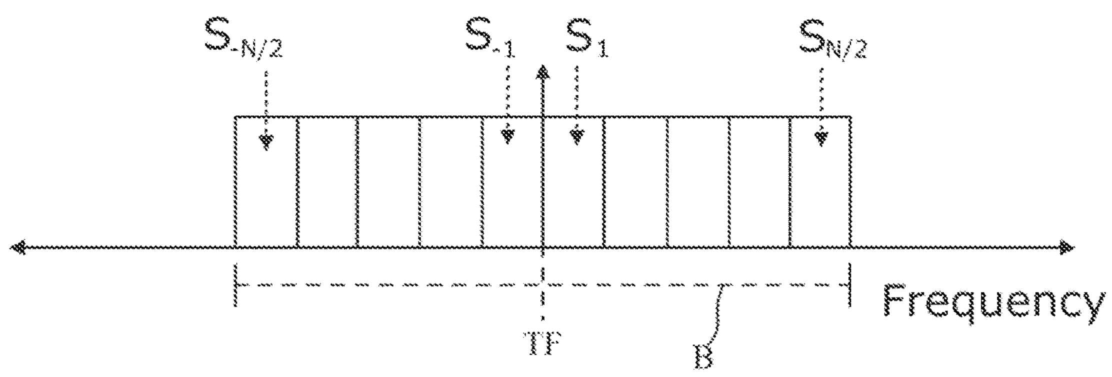
FIG. 3 is a schematic illustration of one modulated tone of a photonic comb, showing upper and lower sidebands divided into sub-bands, to assist with explaining the embodiments of the present invention.

An analog input signal x(t) is modulated onto a first comb (signal comb) by the modulator 16. This essentially transfers the signal onto each tone of the comb, with every tone carrying the complete information of the input signal. FIG. 3 illustrates schematically the resulting spectrum of one modulated tone centered around the original tone frequency TF (i.e. the carrier wave), and now having a bandwidth B related to the bandwidth of the input (modulating) signal. The frequency spectrum comprises an upper side-band of frequencies above the original tone frequency TF, and a lower side-band of frequencies below the original tone frequency TF. The original broadband signal can be divided into N sub-bands; these sub-bands are shown in the upper side-band as slices labelled $S_1$ to $S_{N/2}$, and in the lower side-band as slices labelled $S_{-1}$ to $S_{-N/2}$. The actual amplitude and phase of the signal in each sub-band is not shown in FIG. 3, and will depend on the input signal. However, for any real input signal, the sub-bands have the symmetry property that $S_i$ is the complex conjugate of $S_{-i}$. This is due to the nature of the Fourier transform of any real-valued signal x(t). This property and the spectrum such as FIG. 3 are repeated for every tone of the modulated comb.

Referring to FIG. 2, the modulated first comb (signal comb) is then combined with the second comb (LO comb) by combiner 30. In these embodiments of the invention, the combiner 30 is a coupler/splitter (referred to as a combiner for brevity), such that the first comb is split between two output arms 32, 34, and the second comb is also split between the two output arms 32, 34, and such that the fractions of the two combs directed to each arm are coupled to produce a resulting 'combination' or superposition of the fields. The two output arms 32, 34 may be given the arbitrary designations of 'upper' and 'lower' arms. The splitting ratio of the combiner 30 in this preferred embodiment is 50:50 or as close to substantially 50:50 as reasonably practical. The combiner 30 may also have a transfer function such that there is a phase shift of 90 degrees (π/2) of the signal from one of the inputs into one of the output arms relative to that same signal transferred into the other output arm, as is well known in the art.

Each arm 32, 34 is now directed to a respective spectral filter unit 36. Each spectral filter unit 36 divides the respective light from each arm 32, 34 such that light from separate modulated comb tones of the signal comb is directed to a separate photodetector PD (i.e. a spectral filter unit performs the function of wavelength demultiplexing the light from each arm into channels of spacing $f_{sig}$). The light in each arm from each comb tone of the LO comb is similarly directed by the spectral filter unit 36. It is the beating of the signal comb tone and the off-set LO comb tone at a photodetector that picks out a spectral slice (i.e. sub-band) of the input signal and down converts it to the baseband detected at that photodetector PD. The sub-band spacing is Δf, i.e. the difference between the tone spacing of the first and second combs (signal comb and LO comb). A photodetector PD is provided for each sub-band in each arm from $S_{-N/2}$ to $S_{N/2}$. The signal for the k-th sub-band in one arm is subtracted from the k-th sub-band in the other arm to produce a difference signal which is the in-phase or the quadrature component of the input signal for that sub-band. This can be conveniently achieved by arranging the two detectors for the same sub-band (in the first and second arms) as a balanced photodetector (i.e. a pair of detectors connected such that the output represents the difference signal of the two detectors).

It can be shown that, for a specific phase relationship between the combs combined at the combiner 30, the difference signal for each upper sub-band $s_k(t)$ corresponds to the quadrature (imaginary) component of the input signal for that sub-band $\mathrm{Im}\{S_k(t)\}$, and the difference signal for each lower sub-band $s_{-k}(t)$ corresponds to the in-phase (real) component of the input signal for that sub-band $\mathrm{Re}\{S_k(t)\}$ [if the phase relationship is different from the above specific phase relationship, and/or if the lower arm sub-bands are subtracted from the upper arm sub-bands rather than vice versa, then the upper sub-bands may yield the in-phase components of the input signal and the lower sub-bands may yield the quadrature components of the input signal].

An array of ADCs (not shown) can now digitize the in-phase and quadrature components of every sub-band. The full-field information of the input signal is now in the digital domain, and can be further processed, as desired, using digital signal processing (DSP), either keeping as separate sub-bands or reconstructing the original broadband signal.

As explained above, for this scheme to work, there must be a specific phase relationship (or phase offset) between the two combs when they are combined in order to obtain the correct interference. However, optical path length mismatch in combination with thermal and vibrational effects can induce a drift in the phase offset, which would result in incorrect detection of the input signal. To avoid this, the present embodiment of the invention provides an optical phase-locked loop to lock the phase offset between the two combs at ±45 degrees (π/4). One implementation of this, as shown in FIG. 2, uses a tap coupler 50 to extract a small portion, such as a few percent, of the signal in one of the arms 32, 34. This is then detected by a photodetector 52, from which the output is passed to a controller 54. The photodetector 52 produces an output current or voltage that varies as a function of the phase offset between the combs. The photodetector 52 can be a slow or narrowband detector such that there is some integration of the input signal. The controller 54 then controls a phase-shifter 56 that adjusts the phase of one comb relative to the other comb.

To obtain the necessary 45 degree phase shift, the controller is first calibrated. The phase-shifter 56 is swept over a range of shifts to measure the maximum power (Pmax) and minimum power (Pmin) obtainable at the photodetector 52 from the tap coupler 50 (this can be done in the absence of an input signal). These powers will correspond to a phase offset of either 0 degrees or 180 degrees depending on the transfer function of the combiner 30, and whether the power is being measured in the upper arm 32 or lower arm 34.

The controller 54 is then set to control the phase-shifter 56 such that the measured power is at a predetermined level of either:

$$P\text{min} + \frac{1}{\sqrt{2}}(P\text{max} - P\text{min})$$

or $$P\text{max} - \frac{1}{\sqrt{2}}(P\text{max} - P\text{min})$$

This provides the constant substantially 45 degree phase off-set to enable the input signal sub-bands to be reconstructed from the difference between the sub-bands in the upper and lower arms as described above and illustrated in FIG. 2.

The two combs will have just a single tone in common, which is at the frequency of the seed laser used by the comb generators 12, 14, and is typically called the central tone of the combs, but need not necessarily be at the literal center of the combs. It is effectively the interference of these two tones that causes the average power in one arm to vary as the phase offset between the combs is adjusted; the other tones of the two combs contribute to a general background power level. So, the phase-locked loop, comprising a sensor (tap couple 50 plus photodetector 52), controller 54, and phase-shifter 56, effectively locks the phase of the common or 'central' tone of the two combs, but this has the effect of locking the phase offset between the entirety of the two combs (for a phase-shifter that uniformly adjusts the phase across the breadth of a comb). It is also taken that the optical path length from the combiner 30 to each of the photodetectors PD is the same via the upper arm 32 and via the lower arm 34, to ensure correct signal reconstruction (or that any path difference is constant and can be compensated for).

Figure 4:
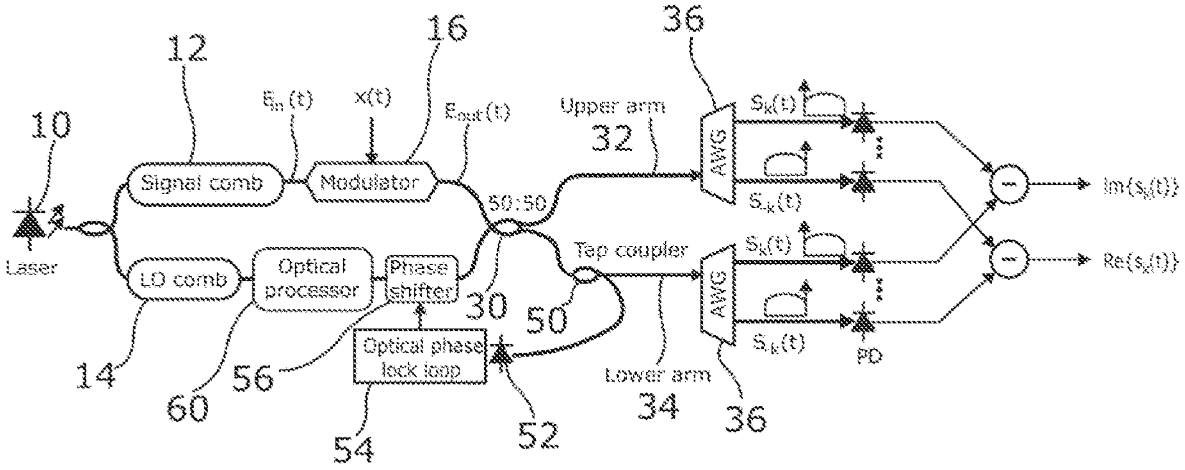
FIG. 4 is a schematic illustration of a signal processor apparatus according to a second embodiment of the invention.

A second embodiment of the invention, which can have a fundamental signal-to-noise ratio that is 3 dB higher than the first embodiment, is illustrated in FIG. 4. In this case, the phase-locked loop is set to lock the phase of the common tone of the two combs at 0 or 180 degrees, by maximizing or minimizing the power in one of the arms 32, 34.

However, in addition to the components of the first embodiment of FIG. 2, in the second embodiment of FIG. 4 there is an optical processor 60 that operates on one of the combs prior to the combiner 30. The optical processor is arranged to create a 90 degree phase shift between the tones of that comb below a predetermined frequency and the tones of that comb above a predetermined frequency. This is explained with reference to FIG. 5, which illustrates schematically the tones of a comb as a plot of amplitude against frequency. The predetermined frequency is PF; the tones below the predetermined frequency form a lower comb portion LC, and the tones above the predetermined frequency form an upper comb portion UC. The optical processor creates a phase offset of 90 degrees between the lower comb portion LC and the upper comb portion UC (as indicated in the lower portion of FIG. 5). This could be done by advancing or retarding the upper comb by 90 degrees while the lower comb is unchanged, or by advancing or retarding the lower comb by 90 degrees while the upper comb is unchanged, or by shifting one of the upper or lower comb by +45 degrees and shifting the other of the upper or lower comb by −45 degrees, or by any intermediate combination such that the net effect is a phase offset of 90 degrees between the upper comb portion UC and the lower comb portion LC.

Figure 5:
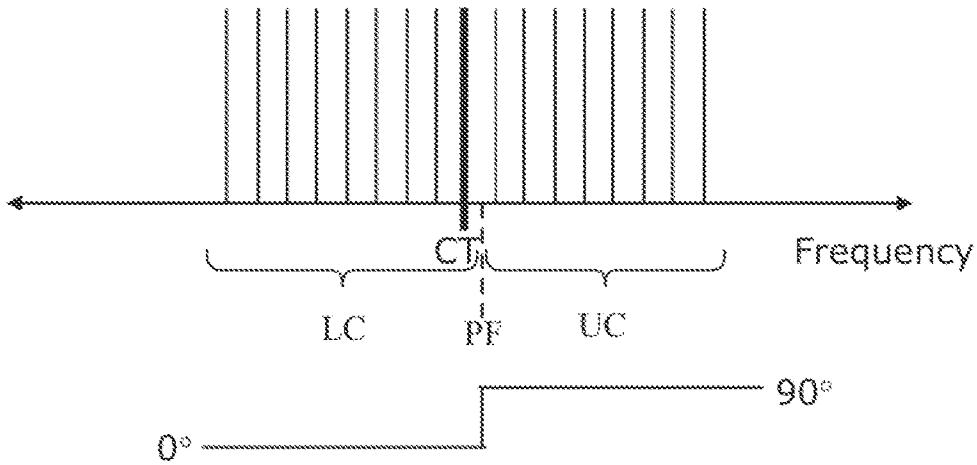
FIG. 5 is a schematic illustration of a frequency spectrum of a photonic comb to assist with explaining the second embodiment of the invention.

The common tone CT frequency (common to both of the first and second combs; equal to the seed frequency) will either be in the lower comb portion LC (as illustrated in FIG. 5) if it is below the predetermined frequency PF, or it will be in the upper comb portion UC if above the predetermined frequency PF. The phase-shifter 56 adjusts the phase of all of the tones of one comb relative to the other comb, but does not alter the relative phase offset between the upper comb portion UC and the lower comb portion LC in the comb on which it operates. The phase-locked loop dynamically maximizes or minimizes the power in one of the arms; this is equivalent to locking the phase of the common tone at 0 or 180 degrees between the two combs (signal comb and LO comb). If the common tone CT is in the lower comb portion LC, then all the tones in the lower comb portion are also locked at 0 or 180 degrees with respect to the other comb, and the tones in the upper comb portion UC will be locked at 90 or 270 (−90) degrees with respect to the other comb. If the common tone CT is in the upper comb portion UC, then all the tones in the upper comb portion are also locked at 0 or 180 degrees with respect to the other comb, and the tones in the lower comb portion LC will be locked at 90 or 270 degrees with respect to the other comb. Because of the natural comb symmetry and the symmetry between the upper and lower sidebands of the comb modulated by the input signal, it can be shown that the same detection scheme can be used to obtain the in-phase and quadrature components of each sub-band as before, and thus the full-field information for every sub-band can be captured. As in the first embodiment, the captured information can easily be converted to the digital domain by conventional ADCs, and then subjected to DSP.

In the above embodiments, full use is made of all optical power by using both the upper and lower sidebands, and using the full frequency combs; both the upper and lower arms are used, so no power is discarded. This increases the system performance and efficiency. Furthermore, the phase-locked loop protects the apparatus from environmental perturbations, and allows for continuous real-time signal analysis.

VARIANTS AND IMPLEMENTATIONS

An example of a laser source 10 for use with embodiments of the invention is a continuous wave infrared laser with a power of 3 W and wavelength of 1550 nm or 1300 nm, as known from telecommunications.

The photonic comb generators 12, 14 in one example have tone spacings of 26 GHz (signal comb) and 27 GHz (LO comb) and generate 24 tones. Ultra-wide band frequency combs are known with free spectral ranges of well over 100 GHz, and approaching 1000 GHz. Two examples of methods by which the photonic comb generators 12, 14 can generate the combs are by phase and/or amplitude modulation of the seed laser, or by four wave mixing in an appropriate non-linear medium.

The modulator 16 can comprise a Mach-Zender modulator (MZM), for example using lithium niobate, with a bandwidth of at least 50 GHz, or around 100 GHz, modulated by the input signal in electronic form.

Using these components, the apparatus can be configured as a full-field ADC for the input signal with a bandwidth of at least 10 GHz, such as at least 20 GHz, at least 50 GHz, or ideally at least 100 GHz.

In the preferred embodiments, the light is conveyed through the apparatus in a waveguide, such as an optical fiber, and the combiner 30 is an all-fiber device.

The phase-shifter 56 is shown in FIGS. 2 and 4 as operating solely on the LO comb, but equally could operate on the signal comb, or indeed on both combs. The phase-shifter 56 can operate using any suitable principle, for example piezo-electric, thermal or current driven.

Similarly, the optical processor 60 of FIG. 4 could operate on either the LO comb or the signal comb, and could be before or after the phase-shifter 56, or before or after the modulator 16. The optical processor 60 can be, for example, an optical grating or a commercially available wave-shaper. Ideally, the predetermined frequency PF separating the upper and lower comb portions UC, LC is adjacent to the common tone frequency CT.

The tap coupler 50 could be on either arm 32, 34, or there could be two couplers, one on each arm, with suitable photodetectors, provided they constitute a sensor system for producing an output related to the phase difference between the first and second combs.

Each spectral filter unit 36 can be, for example, an arrayed waveguide grating (AWG), or wavelength division multiplexer (WDM) (operating as a de-multiplexer).

As explained above, the photodetectors PD can be arranged as balanced pairs, with a single ADC for the output of each pair. Alternatively, each photodetector could be provided with its own ADC, and then the subtraction to obtain the in-phase and quadrature components of each sub-band could be performed in the digital domain.

In preferred embodiments of the invention, prior to each ADC the analog signal for each sub-band is passed through a low-pass filter (not shown) to provide anti-aliasing. This filtering removes any high frequency components (from the rest of the input signal) that will cause aliasing at the low-speed ADCs. The bandwidth of each ADC (half its sampling rate), and the bandwidth of any analog electronics between the photodiode and the ADC, only needs to be $\Delta f/2$ (half the sub-channel width) because each sub-channel is only detecting an intensity modulated signal. After coherent summation with its symmetric comb line pair, the full sub-band width signal is recovered. Similarly, the cut-off frequency of each low-pass anti-aliasing filter needs to be at least $\Delta f/2$. In practice, each ADC bandwidth is preferably higher than $\Delta f/2$, such that the overlap frequency region can be used to help reconstruct the full signal. The anti-aliasing filter bandwidth should also be equal to or larger than $\Delta f/2$, but lower than or equal to the Nyquist bandwidth (half the sampling rate) of the sub-band ADC (i.e. the ADC 'maximum frequency'). In one specific embodiment, with $\Delta f=1$ GHz, 650 MHz low-pass filters and 2.4 GSPS (1.2 GHz maximum frequency) ADCs are used.

Theoretically there are no limitations on the sub-band widths or number of sub-bands. In practice it is a trade-off between loss in optical power (as the optical power becomes distributed among more comb lines) versus gain in ADC resolution by reducing the width of each sub-band. Thus one can pick a sub-band width that gives as high a resolution as desired, but while maintaining sufficient power in each sub-band.

The controller 54 can be, for example, a proportional-derivative controller (particularly suitable for the first embodiment of the invention), a proportional-integral-derivative (PID) controller, or lock-in controller (particularly suitable for the second embodiment of the invention).

According to preferred embodiments, an optical filter is placed after either one or other comb generator 12, 14, or a respective filter is placed after each comb generator 12, 14, to suppress undesired noise in the optical domain between comb lines. Preferably the filter function of the or each filter substantially matches the spectral shape of the respective comb in the frequency domain. The or each filter is preferably placed before any further optical components such as modulator 16 or phase shifter 56. One example of a suitable filter is a Fabry-Perot interferometer/cavity with high finesse and free spectral range equal to the frequency comb line.

The phase noise between the lines of a frequency comb is correlated. Therefore, the phase noise introduced into each channel by both frequency combs will also be correlated across all channels. According to another optional embodiment, a portion of both the unmodulated combs is tapped off such that any phase noise (or jitter) between the two combs can be observed and potentially corrected. One way to implement this is to tap off a small portion of the output of each comb generator 12, 14 (or obtain representative light from an intermediate stage within each comb generator 12, 14). The tapped light from the two combs is combined and detected by a photodetector. Optical bandpass filtering can optionally be applied before detection e.g. to select the 1st comb line pair. The output of the photodetector is converted to a digital output by an ADC. The beating between the two unmodulated frequency combs can be detected in the digital output in order to record the relative phase fluctuations between the combs and then compensate for this phase noise. The compensation can be done in further DSP performed on the broadband signal (or its sub-bands) output from the main apparatus. Alternatively, if some features of the signal being processed are known (e.g. modulation format in digital communications), then a phase noise compensation algorithm can be applied to the received signal. These techniques that use an unmodulated (or modulated with a known signal) channel to guide the phase noise compensation, may be referred to as using a "pilot" or "pilot signal".

In embodiments of the invention, some or all of the optical components can be integrated to provide a compact or portable instrument.

In accordance with the provisions of the patent statutes, the present invention has been described in what is considered to represent its preferred embodiment. However, it should be noted that the invention can be practiced otherwise than as specifically illustrated and described without departing from its spirit or scope.

The invention claimed is:

1. A signal processor apparatus comprising:

a first photonic comb generator generating a first comb with a first tone spacing;

a second photonic comb generator generating a second comb with a second tone spacing, the second tone spacing being different from the first comb tone spacing;

a modulator modulating the first comb with an analog input signal;

a combiner combining the modulated first comb with the second comb and directing the combination result to a first arm and to a second arm;

a spectral filter unit for each of the arms dividing the combination result in each of the arms into a plurality of sub-bands;

a plurality of photodetectors including one of the photodetectors for each of the sub-bands of each of the arms, each of the photodetectors outputting an electrical signal carrying information on a respective one of the sub-bands;

a phase-shifter adjusting a relative phase of the first and second combs with respect to each other prior to the combiner;

a sensor system producing an output related to a phase difference between the first and second combs at the combiner; and a controller controlling the phase-shifter based on the output of the sensor system.

2. The apparatus according to claim 1 wherein the sensor system, the controller, and the phase-shifter form a phase-locked loop.

3. The apparatus according to claim 1 wherein the controller controls the phase-shifter such that an optical power in the first arm or in the second arm is at a predetermined level between a maximum obtainable power level and a minimum obtainable power level in the respective arm.

4. The apparatus according to claim 1 wherein the controller locks the relative phase between the first and second combs at +45 degrees or −45 degrees at the combiner.

5. The apparatus according to claim 1 including an optical processor processing one of the combs prior to the combiner to create a 90 degree phase shift between ones of the comb tones below a predetermined frequency and ones of the comb tones higher than the predetermined frequency, and wherein the controller controls the phase-shifter such that an optical power in the first arm or in the second arm is maximized or is minimized.

6. The apparatus according to claim 1 including an optical processor processing one of the combs prior to the combiner to create a 90 degree phase shift between ones of the comb tones below a predetermined frequency and ones of the comb tones higher than the predetermined frequency, and wherein the controller locks the relative phase between the frequencies of the first and second combs below the predetermined frequency at 0 degrees or 180 degrees at the combiner, or wherein the controller locks the relative phase between the frequencies of the first and second combs above the predetermined frequency at 0 degrees or 180 degrees at the combiner.

7. The apparatus according to claim 1 wherein an output of the photodetector for each of the sub-bands in one of the arms is subtracted from an output of the photodetector for a corresponding one of the sub-bands in another of the arms.

8. The apparatus according to claim 7 wherein each of the photodetectors is connected at an output with an associated analog-to-digital converter.

9. The apparatus according to claim 7 wherein the photodetectors for corresponding ones of the sub-bands in the first and second arms are arranged as a balanced photodetector.

10. The apparatus according to claim 9 wherein each of the balanced photodetectors is connected with an associated analog-to-digital converter.

11. The apparatus according to claim 7 wherein the subtracted outputs across all of the sub-bands provide in-phase and quadrature sub-band components of an input signal to the first and second photonic generators.

12. The apparatus according to claim 1 wherein the first and second photonic comb generators are seeded from a same laser source.

13. The apparatus according to claim 1 wherein the combiner is an optical coupler/splitter with a 50:50 splitting ratio.

14. The apparatus according to claim 1 wherein the sensor system includes a tap coupler in one of the first arm and the second arm and a photodetector detecting an optical power in the one arm.

15. An analog-to-digital converter comprising the apparatus according to claim 1 including a source input connected to the first and second photonic comb generators and wherein each of the photodetectors is connected at an output with an associated analog-to-digital converter.

16. The analog-to-digital converter according to claim 15 having a bandwidth of at least 10 GHz.

17. A signal processor apparatus comprising:

a first photonic comb generator generating a first comb with a first tone spacing;

a second photonic comb generator generating a second comb with a second tone spacing, the second tone spacing being different from the first tone spacing;

a modulator modulating the first comb with an analog input signal;

a combiner combining the modulated first comb with the second comb and directing the combination result to a first arm and to a second arm;

a spectral filter unit for each of the arms dividing the combination result in each of the arms into a plurality of sub-bands;

a plurality of photodetectors including one of the photodetectors for each of the sub-bands of each of the arms, each of the photodetectors outputting an electrical signal carrying information on a respective one of the sub-bands, wherein the photodetector output for each of the sub-bands in one of the arms is subtracted from the photodetector output for a corresponding one of the sub-bands in another of the arms;

a phase-shifter adjusting a relative phase of the first and second combs with respect to each other prior to the combiner;

a sensor system producing an output related to a phase difference between the first and second combs at the combiner; and a controller controlling the phase-shifter based on the output of the sensor system thereby locking a specific phase relationship between the first and second combs at the combiner.

18. The apparatus according to claim 17 wherein the sensor system, the controller, and the phase-shifter form a phase-locked loop.

19. The apparatus according to claim 17 wherein one of the combs includes a plurality of comb tones below a predetermined frequency and a plurality of comb tones higher than the predetermined frequency, and including an optical processor processing the one of the combs prior to the combiner to create a 90 degree phase shift between the comb tones below the predetermined frequency and the comb tones higher than the predetermined frequency, and wherein the controller controls the phase-shifter such that an optical power in the first arm or in the second arm is maximized or is minimized.

20. The apparatus according to claim 17 wherein one of the combs includes a plurality of comb tones below a predetermined frequency and a plurality of comb tones higher than the predetermined frequency, and including an optical processor processing one of the combs prior to the combiner to create a 90 degree phase shift between the comb tones below the predetermined frequency and the comb tones higher than the predetermined frequency, and wherein the controller locks the relative phase between the frequencies of the first and second combs below the predetermined frequency at 0 degrees or 180 degrees at the combiner, or wherein the controller locks the relative phase between the frequencies of the first and second combs above the predetermined frequency at 0 degrees or 180 degrees at the combiner.

* * * * *